United States Patent
Hatakeyama et al.

(10) Patent No.: US 9,360,760 B2
(45) Date of Patent: Jun. 7, 2016

(54) PATTERN FORMING PROCESS AND SHRINK AGENT

(71) Applicant: Shin-Etsu Chemical Co., Ltd., Tokyo (JP)

(72) Inventors: Jun Hatakeyama, Joetsu (JP); Teppei Adachi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/716,982

(22) Filed: May 20, 2015

(65) Prior Publication Data

US 2015/0338744 A1    Nov. 26, 2015

(30) Foreign Application Priority Data

May 26, 2014 (JP) .................. 2014-108120

(51) Int. Cl.
*G03F 7/004* (2006.01)
*G03F 7/40* (2006.01)
(Continued)

(52) U.S. Cl.
CPC . *G03F 7/40* (2013.01); *C08F 26/06* (2013.01); *C08F 226/02* (2013.01); *C08L 33/14* (2013.01); *C08L 39/00* (2013.01); *G03F 7/0045* (2013.01);
(Continued)

(58) Field of Classification Search
CPC ....... G03F 7/11; G03F 7/0045; G03F 7/0046; G03F 7/32; G03F 7/40; C08F 226/02; C08F 226/06; C08F 26/02; C08F 26/06; C08F 22/22; C08F 22/36; C08F 22/38; C08F 220/26; C08F 220/30; C08F 220/34; C08F 220/36; C08F 2220/083; C08F 2220/285; H01L 21/0274

USPC .......... 430/270.1, 271.1, 322, 325, 329, 330, 430/331, 434, 435; 526/258, 303.1, 306, 526/307.4
See application file for complete search history.

(56) References Cited

U.S. PATENT DOCUMENTS

| | | | |
|---|---|---|---|
| 6,136,500 A | 10/2000 | Kobayashi et al. | |
| 6,579,657 B1 | 6/2003 | Ishibashi et al. | |
| 7,537,880 B2 | 5/2009 | Harada et al. | |
| 7,592,127 B2 * | 9/2009 | Nozaki | G03F 7/0035 430/270.1 |
| 8,101,333 B2 * | 1/2012 | Noya | G03F 7/40 430/270.1 |
| 8,338,080 B2 * | 12/2012 | Kozawa | G03F 7/40 430/273.1 |

(Continued)

FOREIGN PATENT DOCUMENTS

JP  10-73927 A  3/1998
JP  3991462 B2  10/2007

(Continued)

OTHER PUBLICATIONS

Yi et al., "Contact Hole Patterning for Random Logic Circuits using Block Copolymer Directed Self-Assembly", Proc. of SPIE, 2012, pp. 83230W-1-83230W-6, vol. 8323.

*Primary Examiner* — Amanda C Walke
(74) *Attorney, Agent, or Firm* — Westerman, Hattori, Daniels & Adrian, LLP

(57) ABSTRACT

A negative pattern is formed by applying a resist composition onto a substrate, exposing the resist film, and developing the exposed resist film in an organic solvent developer. The process further involves coating the negative pattern with a shrink agent solution of a polymer comprising recurring units having a tertiary amino group in a $C_6$-$C_{12}$ ether, $C_4$-$C_{10}$ alcohol, $C_6$-$C_{12}$ hydrocarbon, $C_6$-$C_{16}$ ester or $C_7$-$C_{16}$ ketone solvent, baking the coating, and removing the excessive shrink agent for thereby shrinking the size of spaces in the pattern.

10 Claims, 2 Drawing Sheets

(51) Int. Cl.
*C08L 33/14* (2006.01)
*C08L 39/00* (2006.01)
*G03F 7/11* (2006.01)
*G03F 7/32* (2006.01)
*C08F 226/02* (2006.01)
*C08F 26/06* (2006.01)
*H01L 21/027* (2006.01)
*C08F 220/34* (2006.01)
*C08F 220/36* (2006.01)
*C08F 220/28* (2006.01)
*C08F 220/30* (2006.01)
*C08F 220/38* (2006.01)

(52) U.S. Cl.
CPC .. *G03F 7/11* (2013.01); *G03F 7/32* (2013.01); *H01L 21/0274* (2013.01); *C08F 220/34* (2013.01); *C08F 220/36* (2013.01); *C08F 2220/281* (2013.01); *C08F 2220/283* (2013.01); *C08F 2220/301* (2013.01); *C08F 2220/303* (2013.01); *C08F 2220/346* (2013.01); *C08F 2220/382* (2013.01)

(56) References Cited

U.S. PATENT DOCUMENTS

| | | |
|---|---|---|
| 2008/0090172 A1 | 4/2008 | Hatakeyama et al. |
| 2008/0153030 A1 | 6/2008 | Kobayashi et al. |
| 2010/0119717 A1 | 5/2010 | Hong et al. |
| 2013/0071788 A1* | 3/2013 | Hatakeyama ............ G03F 1/00 430/285.1 |
| 2014/0127478 A1* | 5/2014 | Okamura ............ C08F 226/02 428/195.1 |
| 2015/0017587 A1* | 1/2015 | Okayasu ............ H01L 21/0273 430/315 |
| 2015/0086929 A1* | 3/2015 | Hatakeyama ............ G03F 7/40 430/324 |

FOREIGN PATENT DOCUMENTS

| | | |
|---|---|---|
| JP | 2008-111103 A | 5/2008 |
| JP | 2008-122932 A | 5/2008 |
| JP | 2008-158339 A | 7/2008 |
| JP | 2008-275995 A | 11/2008 |
| JP | 2012-37867 A | 2/2012 |

* cited by examiner

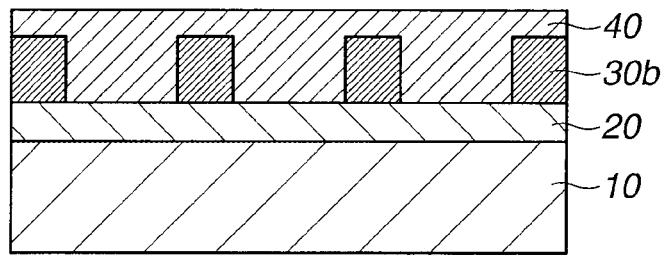
FIG.2D  COATING OF SHRINK AGENT
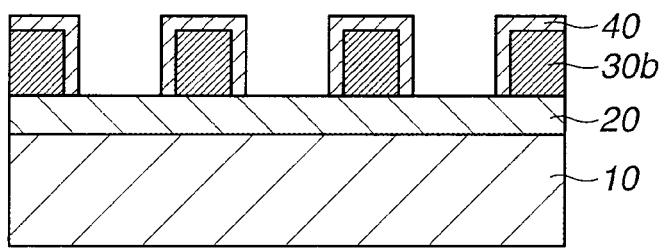
FIG.2E  REMOVAL OF SHRINK AGENT
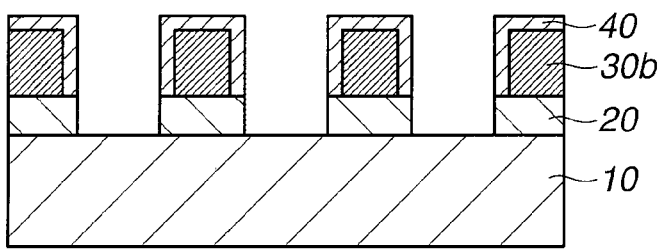
FIG.2F  DRY ETCHING THROUGH SHRINK AGENT/RESIST MASK

PATTERN FORMING PROCESS AND SHRINK AGENT

CROSS-REFERENCE TO RELATED APPLICATION

This non-provisional application claims priority under 35 U.S.C. §119(a) on Patent Application No. 2014-108120 filed in Japan on May 26, 2014, the entire contents of which are hereby incorporated by reference.

TECHNICAL FIELD

This invention relates to a pattern forming process comprising forming a resist pattern via resist coating, exposure and development, coating the resist pattern with a shrink agent, baking, and removing the excessive shrink agent for shrinking the size of spaces in the resist pattern.

BACKGROUND ART

While the effort to reduce the pattern rule is in rapid progress to meet the recent demand for higher integration density and operating speed of LSIs, the photolithography is on widespread use. The photolithography has the essential limit of resolution determined by the wavelength of a light source. One micropatterning approach to go beyond the limit of resolution is by combining ArF excimer laser immersion lithography with double patterning. One typical version of double patterning is litho-etch-litho-etch (LELE) process involving forming a pattern via exposure, transferring the pattern to a hard mask on a substrate by etching, effecting second exposure at a half-pitch shifted position, and etching the hard mask. This process has the problem of misalignment between two exposures or overlay error. Another version of double patterning is self-aligned double patterning (SADP) process involving the steps of transferring a resist pattern to a hard mask, growing a film on opposite sides of hard mask features, and leaving sidewalls of film for thereby doubling pattern size. The SADP process needs exposure only once and mitigates the problem of overlay error. To simplify the process, a modified version of the SADP process of forming a silicon oxide film on sidewalls of resist pattern features as developed rather than sidewalls of hard mask features for thereby doubling pattern size is also proposed. Since the SADP process is successful in reducing the pitch of line pattern to half, the pitch can be reduced to ¼ by repeating the SADP process twice.

Not only shrinking of line patterns, but also shrinking of hole patterns is necessary. Unless the hole pattern is shrunk, shrinkage over the entire chip is incomplete. One known method of shrinking a hole pattern is RELACS® method described in JP-A H10-73927. This method intends to reduce the size of a hole pattern by coating a resist pattern as developed with a water-soluble material containing a crosslinker, and baking the coating to form a crosslinked layer on the resist surface for causing the resist pattern to be thickened. JP-A 2008-275995 describes a water-soluble shrink material comprising an amino-containing polymer or polyamine, which bonds to the resist surface via neutralization reaction with carboxyl groups on the resist surface, for thereby thickening the resist film. It is also proposed in Proc. SPIE Vol. 8323 p83230W-1 (2012) to shrink a hole pattern by utilizing the direct self-assembly (DSA) of a block copolymer.

Shrinkage by the RELACS® method has the problem that since a crosslinker becomes active with an acid catalyst within resist, the size of holes is non-uniform after shrinkage if acid diffusion is non-uniform. In the shrink method based on neutralization and bonding of water-soluble amino polymer, the pattern is thickened as direct reflection of irregularities on the resist surface so that dimensional variations of the resist pattern as developed and dimensional variations after shrinkage are identical. There is another problem that the polymer bonds not only to the resist surface, but also to the substrate surface. The shrink method utilizing the DSA function of a block copolymer has advantages including an increased amount of shrinkage and a minimal dimensional variation after shrinkage, but some problems. Namely, if the DSA is applied to holes of different size, shrinkage cannot be induced for those holes of the size that causes a contradictory assembly of block copolymer. If the DSA is applied to a trench pattern, shape deformation becomes a problem, for example, a plurality of hole patterns are formed.

There is a need for a shrink agent which bonds to only the surface of a resist pattern as developed, but not to the substrate surface, can shrink a trench or hole pattern without changing the shape of the resist pattern, and improve the dimensional variation and edge roughness (LWR) of the resist pattern.

CITATION LIST

Patent Document 1: JP-A H10-73927 (U.S. Pat. No. 6,579, 657)
Patent Document 2: JP-A 2008-275995 (US 20100119717)
Non-Patent Document 1: Proc. SPIE Vol. 8323 p83230W-1 (2012)

SUMMARY OF INVENTION

As discussed above, the method of applying a RELACS® material of crosslink type or neutralizing reaction-mediated bond type onto a resist pattern causes no pattern deformation, but fails to reduce the dimensional variation of the resist pattern and allows the material to bond to the substrate surface when the coating weight is increased. The DSA method can reduce the dimensional variation of a hole pattern as developed, but invites pattern deformation when applied to a trench pattern as developed.

An object of the invention is to provide an organic solvent-based shrink agent which when coated onto a resist pattern as developed, bonds or adheres to only the resist surface, but not to the substrate surface and can reduce the dimensional variation of the resist pattern, and when applied to a trench pattern, can shrink the trench size without causing pattern deformation; and a pattern forming process using the same.

The inventors have found that a shrink agent comprising a polymer having tertiary amino group-bearing recurring units in an organic solvent which does not dissolve a resist is useful and that a resist pattern can be shrunk by applying the shrink agent onto the resist pattern, baking, and stripping the excessive shrink agent with an organic solvent.

In one aspect, the invention provides a pattern forming process comprising the steps of applying a resist composition comprising a polymer comprising recurring units having an acid labile group-substituted carboxyl group, an acid generator and an organic solvent onto a substrate, prebaking to form a resist film, exposing the resist film to high-energy radiation, baking the film, developing the exposed resist film in an organic solvent-based developer to form a negative pattern, applying a shrink agent onto the negative pattern, the shrink agent being a solution of a polymer comprising recurring units having a tertiary amino group in a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, baking, and removing the excessive shrink agent for thereby shrinking the size of spaces in the pattern.

In a preferred embodiment, the polymer comprising recurring units having a tertiary amino group has the general formula (1).

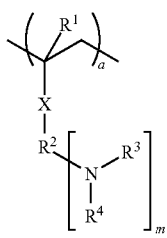

Herein $R^1$ is hydrogen or methyl, X is a single bond, phenylene or —C(=O)—O—, m is 1 or 2, in case of m=1, $R^2$ is a single bond, a straight, branched or cyclic $C_1$-$C_{10}$ alkylene group which may contain an ether moiety, ester moiety, —N= or —S—, a phenylene or naphthylene group, in case of m=2, $R^2$ is a trivalent group obtained by eliminating one hydrogen from the above alkylene, phenylene or naphthylene group of $R^2$ for m=1, $R^3$ and $R^4$ are each independently a straight or branched $C_1$-$C_4$ alkyl group, or $R^3$ and $R^4$ may bond together to form a ring with the nitrogen atom to which they are attached, the ring optionally containing an ether bond, or either one of $R^3$ and $R^4$ may bond with $R^2$ to form a ring with the nitrogen atom to which they are attached, and $0<a\leq1.0$.

In a preferred embodiment, the solvent of the shrink agent is selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, such that the patterned resist film after development may experience a thickness loss of up to 10 nm when the film is kept in contact with the solvent for 30 seconds.

More preferably, the solvent of the shrink agent is selected from the group consisting of di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, butyl acetate, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, and a mixture thereof.

In a preferred embodiment, the removing step uses a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms.

In a preferred embodiment, the polymer in the resist composition comprises recurring units (b) having the general formula (2).

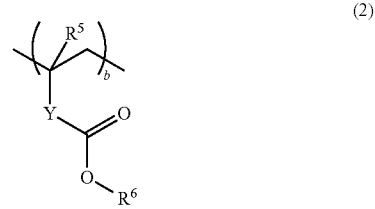

Herein $R^5$ is hydrogen or methyl, $R^6$ is an acid labile group, Y is a single bond or —C(=O)—O—$R^7$—, $R^7$ is a straight, branched or cyclic $C_1$-$C_{10}$ alkylene group which may contain an ether or ester moiety, or naphthylene group, and $0<b<1.0$.

In a preferred embodiment, the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In another aspect, the invention provides a shrink agent for use with a resist pattern for shrinking the size of spaces in the resist pattern, comprising a polymer comprising recurring units having a tertiary amino group and a solvent wherein the polymer is represented by the above formula (1) and the solvent is selected from the same group as above.

Advantageous Effects of Invention

According to the invention, by coating a resist pattern as developed with a shrink agent which is a solution of a polymer comprising recurring units having a tertiary amino group in an ether solvent of 6 to 12 carbon atoms, alcohol solvent of 4 to 10 carbon atoms, hydrocarbon solvent of 6 to 12 carbon atoms, ester solvent of 6 to 16 carbon atoms or ketone solvent of 7 to 16 carbon atoms, baking, and removing the excessive shrink agent, the size of spaces in the resist pattern can be shrunk in a precisely size-controlled manner.

BRIEF DESCRIPTION OF DRAWINGS

FIG. 1 (A) showing a photoresist film formed on a substrate; FIG. 1 (B) showing the photoresist film during exposure; and FIG. 1 (C) showing pattern formation after PEB and development of the photoresist film.

FIG. 2D-F illustrates, in cross-sectional views, later steps of the pattern forming or shrinking process according to the invention; FIG. 2 (D) showing a shrink agent coated on the resist pattern; FIG. 2 (E) showing the resist pattern whose spaces have been shrunk by baking and removal of the excessive shrink agent; and FIG. 2 (F) showing dry etching of the substrate through the shrunk space pattern as a mask.

DESCRIPTION OF PREFERRED EMBODIMENTS

Figure 1A:
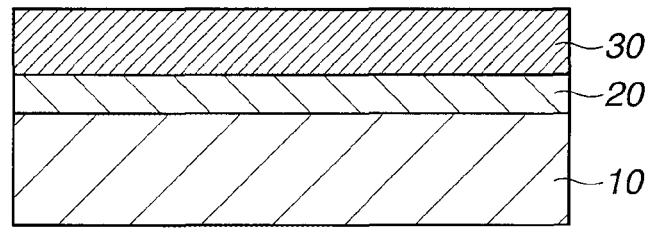
FIG. 1A-C illustrates, in cross-sectional views, early steps of a pattern forming or shrinking process according to the invention.

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer."

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator Searching for a shrink material capable of effectively shrinking a resist pattern as developed and a shrink process using the same, the inventors have found that the size of spaces in a resist pattern as developed can be shrunk in a precisely size-controlled manner by dissolving a polymer comprising recurring units having a tertiary amino group in an ether solvent of 6 to 12 carbon atoms, alcohol solvent of 4 to 10 carbon atoms, hydrocarbon solvent of 6 to 12 carbon atoms, ester solvent of 6 to 16 carbon atoms or ketone solvent of 7 to 16 carbon atoms to form a solution serving as shrink agent, applying the shrink agent onto the resist pattern, baking, and removing the excessive shrink agent with an ether solvent of 6 to 12 carbon atoms, alcohol solvent of 4 to 10 carbon atoms, hydrocarbon solvent of 6 to 12 carbon atoms, ester solvent of 6 to 16 carbon atoms or ketone solvent of 7 to 16 carbon atoms.

The polymer comprising recurring units having a tertiary amino group is highly soluble in the organic solvent which does not dissolve the resist film. On the other hand, a polymer comprising recurring units having a primary or secondary amino group is insoluble in the organic solvent and when applied to the resist pattern, undesirably bonds or adheres not only to the resist surface, but also to the substrate surface. When the polymer having a tertiary amino group is applied to the resist pattern, it bonds to only the resist surface, but not to the substrate surface. The tertiary amino group in the polymer reacts with a carboxyl group on the resist surface to form an ammonium salt. The polymer of ammonium salt form has so low an organic solvent solubility that only the polymer close to the resist surface is not stripped or removed, i.e., is retained. Since the tertiary amino polymer does not form an ammonium salt on the substrate surface, the tertiary amino polymer on the substrate surface is stripped or removed. Thus the tertiary amino polymer bonds to only the resist surface, achieving thickening and shrinkage of the resist pattern.

The shrink agent used in the pattern forming process of the invention is a solution of a polymer in a solvent. The shrink agent is based on a polymer comprising recurring units having a tertiary amino group, preferably recurring units (a) having the general formula (1).

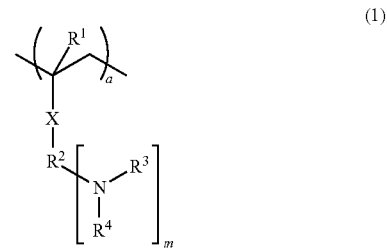

Herein $R^1$ is hydrogen or methyl, X is a single bond, phenylene or —C(=O)—O—, and m is 1 or 2. In case of m=1, $R^2$ is a single bond, a straight, branched or cyclic $C_1$-$C_{10}$ alkylene group which may contain an ether moiety, ester moiety, —N= or —S—, a phenylene or naphthylene group. In case of m=2, $R^2$ is a trivalent group obtained by eliminating one hydrogen from the above alkylene, phenylene or naphthylene group of $R^2$ for m=1. $R^3$ and $R^4$ are each independently a straight or branched $C_1$-$C_4$ alkyl group, or $R^3$ and $R^4$ may bond together to form a ring with the nitrogen atom to which they are attached, the ring optionally containing an ether bond, or either one of $R^3$ and $R^4$ may bond with $R^2$ to form a ring with the nitrogen atom to which they are attached, and a is a number in the range: 0<a≤1.0.

It should be avoided that when the shrink agent solution is applied onto a resist pattern, the resist pattern is dissolved in the solvent of the shrink agent. To this end, the solvent of the shrink agent must be selected from those solvents that do not dissolve the resist film. The solvents that do not dissolve the resist film include ether solvents of 6 to 12 carbon atoms, alcohol solvents of 4 to 10 carbon atoms, hydrocarbon solvents of 6 to 12 carbon atoms, ester solvents of 6 to 16 carbon atoms, ketone solvents of 7 to 16 carbon atoms, and water. Although a number of water-based shrink agents are already proposed as alluded to previously, they are difficult to quickly apply to large-diameter wafers because of the high surface tension of water. A problem arises particularly in the case of a fine hole pattern formed via negative development. When holes are filled with the shrink agent by spin coating, the water solvent having a high surface tension prevents the shrink agent from burying in the holes to the bottom. In contrast, when a shrink agent dissolved in an organic solvent having a lower surface tension than water is applied, the ability to fill or bury to the hole bottom is improved. To increase the solubility of a polymer in the above-listed organic solvents, tertiary amino-bearing units (a) are essential for the polymer.

On the surface of a patterned resist film onto which the shrink agent is applied, carboxyl groups and an acid catalyst are present. A water-soluble shrink agent having an amino group bonds to the resist film surface via neutralization reaction and penetration therein, thereby accomplishing shrinkage. If a polymer comprising recurring units having a primary amino group, which is to ensure water solubility, is used as the water-soluble shrink agent, it bonds not only to the resist surface, but also to the substrate surface because the primary amino group is highly reactive. For the same reason, polyvinyl imidazole bonds to the substrate surface in a substantial buildup. Polyvinyl pyrrolidone and polyacrylamide, which are also water-soluble polymers, bond to the resist surface in a small amount because of weak basicity. On use of basic water-soluble polymers, a difficult adjustment is needed to gain a difference in bond amount (or coating weight) between substrate surface and resist surface.

As the organic solvent-type basic polymer, on the other hand, a polymer of tertiary amine type is used so that it may be dissolved in organic solvents. Since tertiary amine has low reactivity despite high basicity, it bonds to only the resist surface. Once a polymer of tertiary amine type forms an amine salt with a carboxyl group on the resist pattern surface, it turns insoluble in ether and alcohol solvents. After stripping or removal, only the amino polymer bonded to the resist surface is retained, resulting in the resist pattern being thickened (i.e., increased in film thickness).

The recurring units (a) as represented by formula (1) are derived from those monomers having the general formula Ma. Herein $R^1$ to $R^4$, X, and m are as defined above.

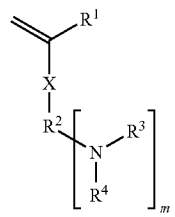

Ma

Examples of the monomer Ma are shown below.

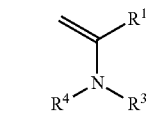 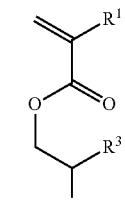 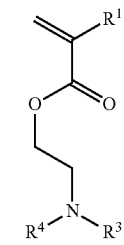

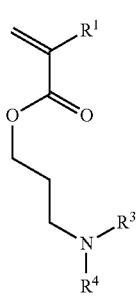 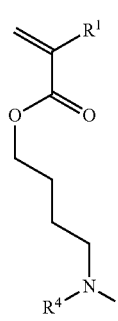 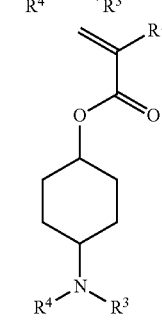

-continued

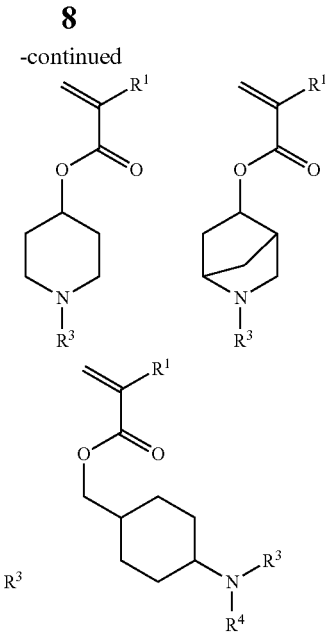

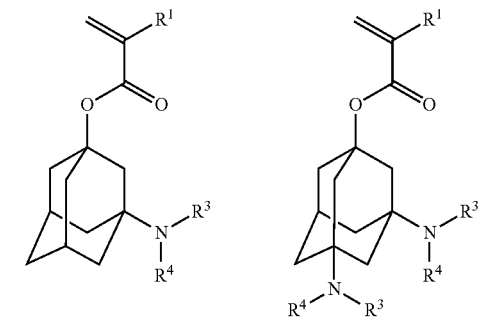

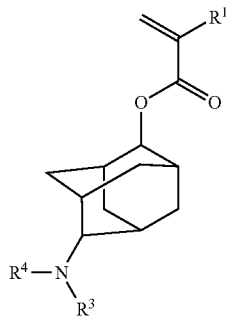

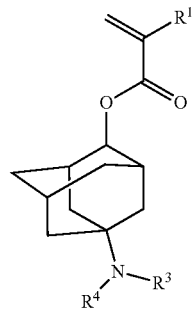

-continued
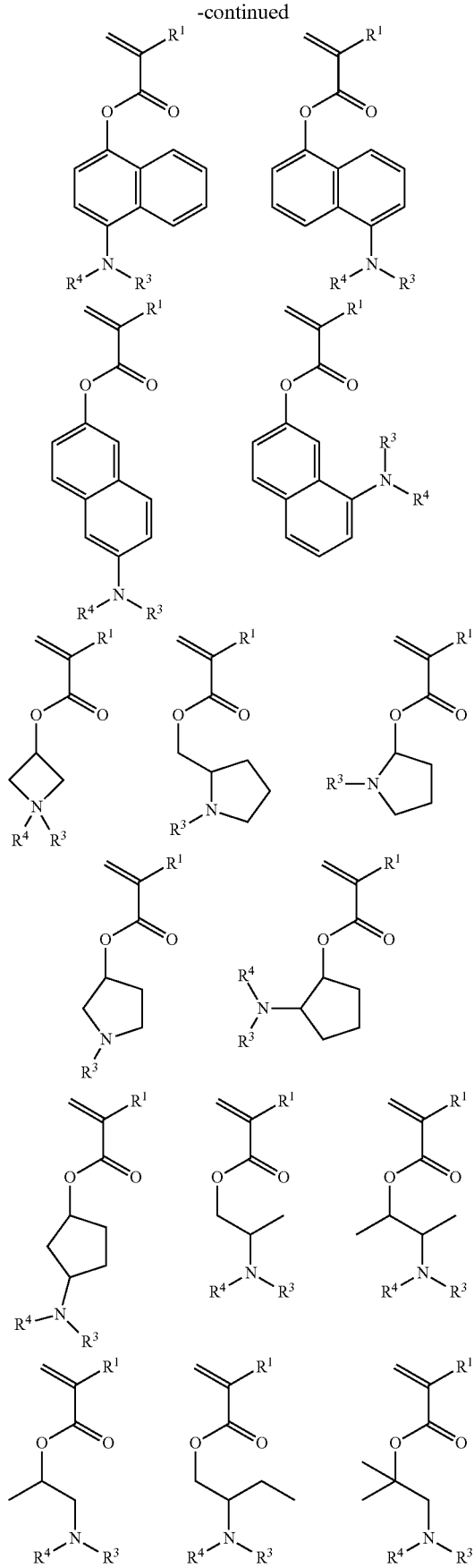
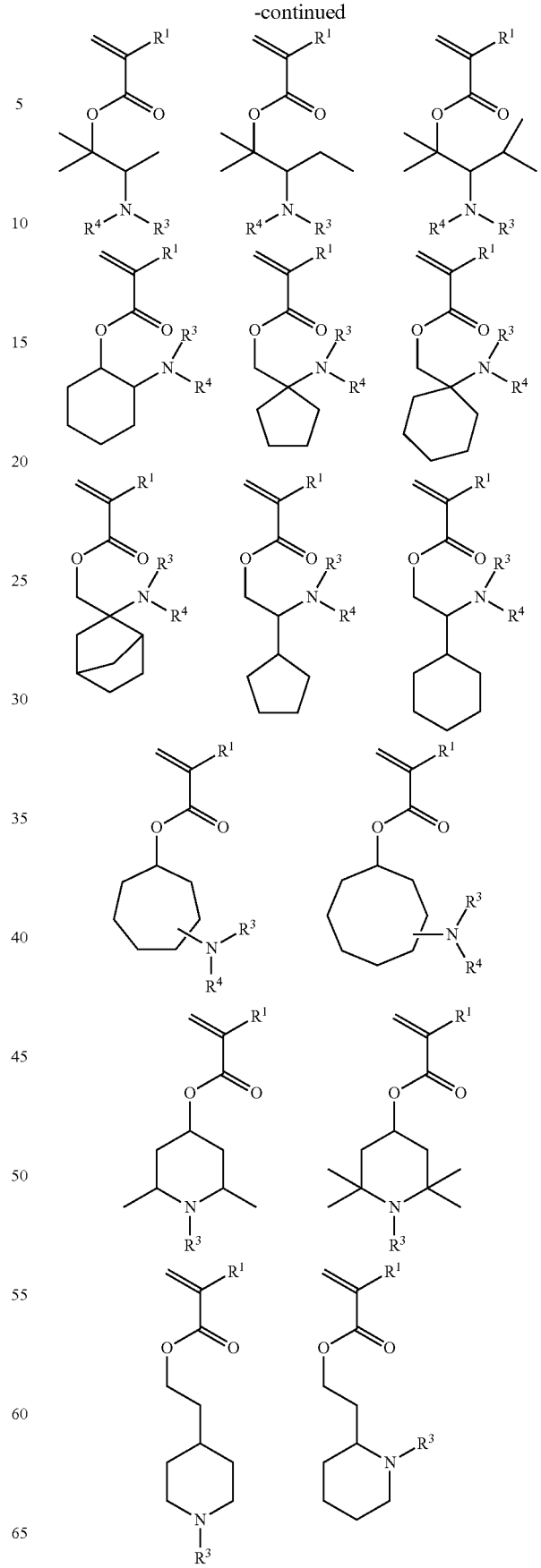

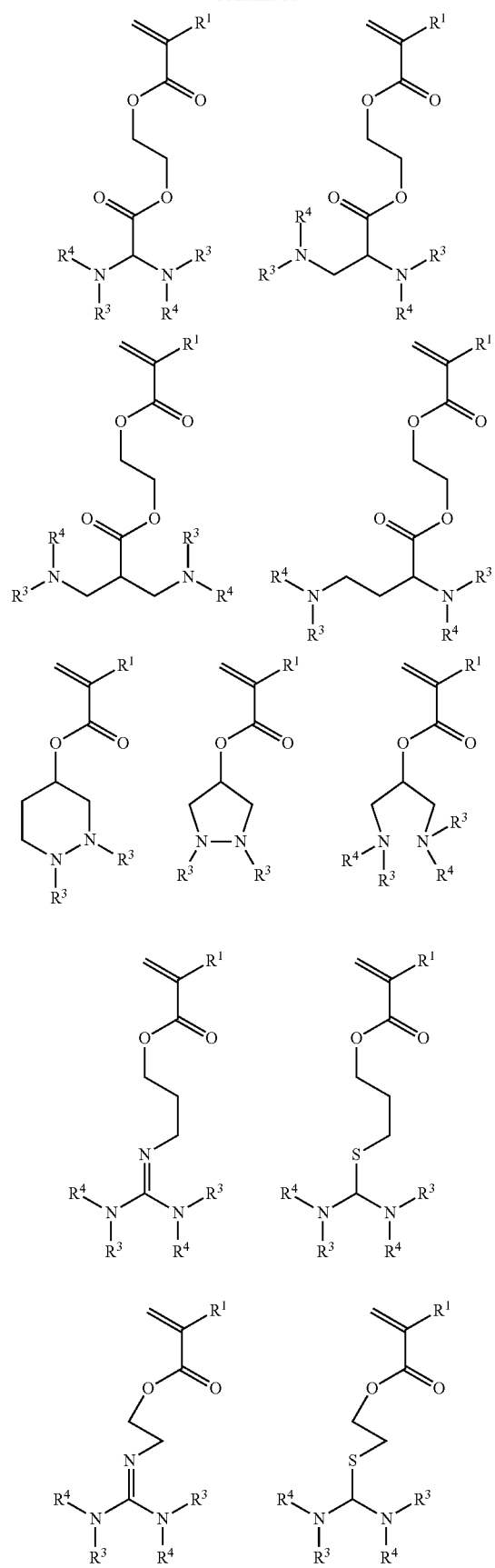
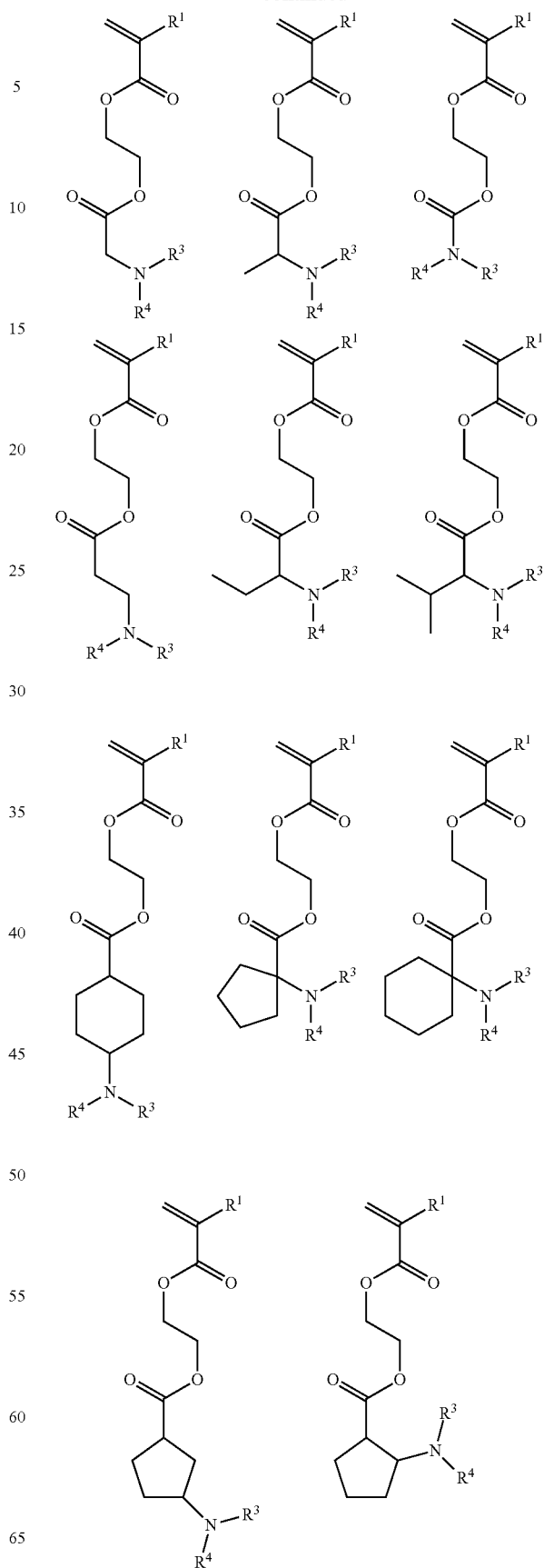

-continued
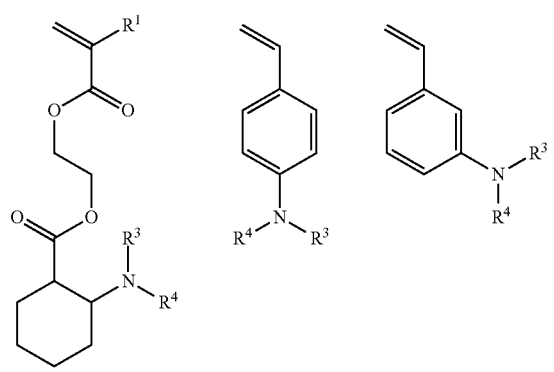
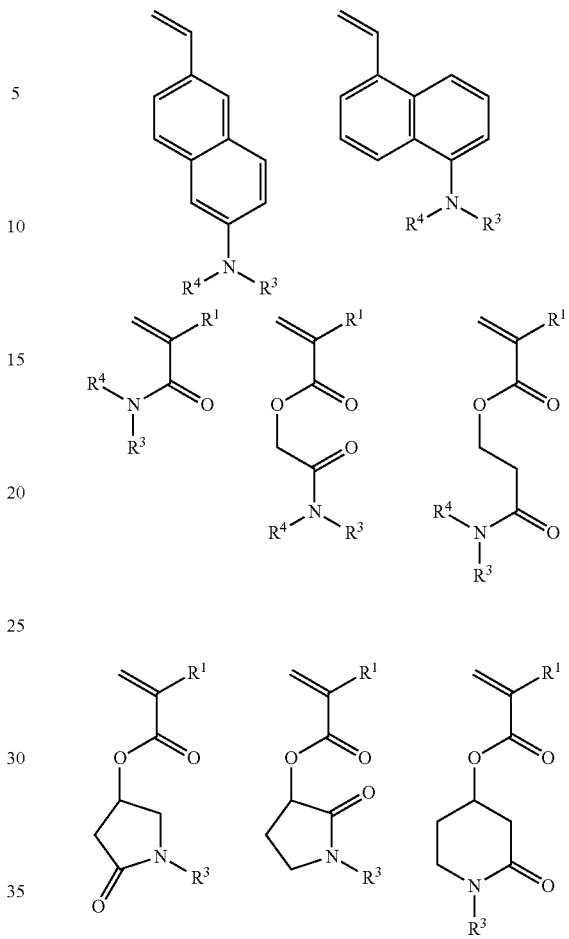
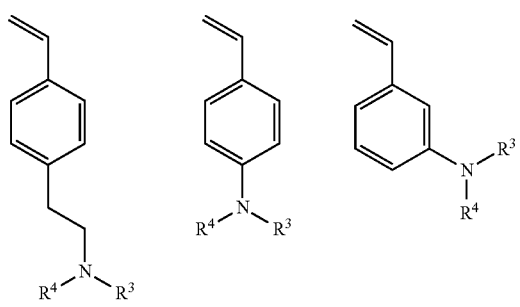
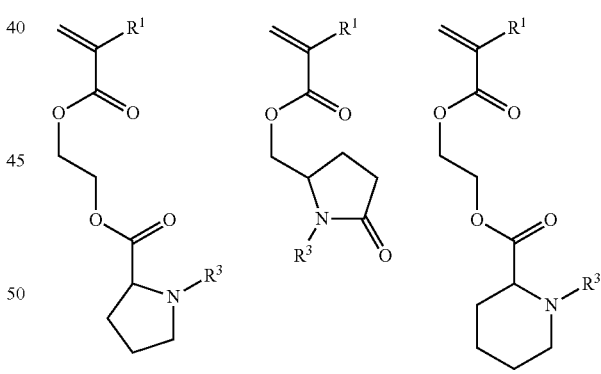
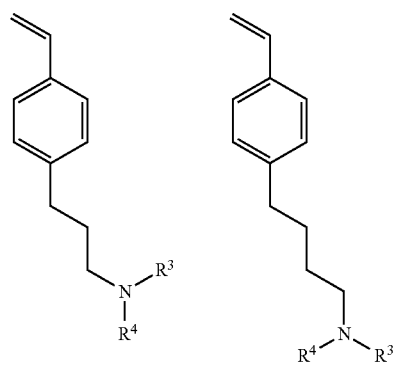
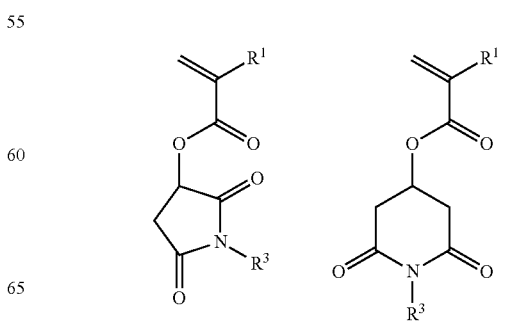

-continued

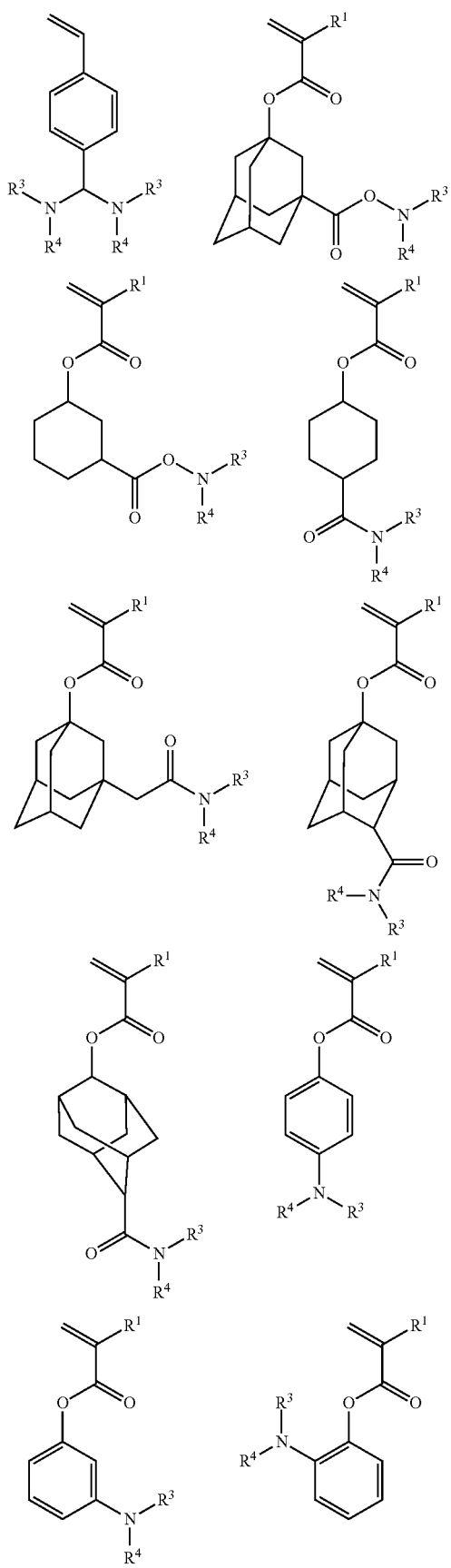

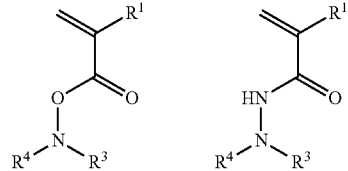

Herein $R^1$, $R^3$, and $R^4$ are as defined above. Specifically, $R^3$ and $R^4$ are methyl, ethyl, n-propyl, isopropyl, n-butyl or isobutyl. When $R^3$ and $R^4$ bond together to form a ring with the nitrogen atom to which they are attached, exemplary rings are morpholine, piperidine and pyrrolidine.

In the polymer comprising the aforementioned recurring units (a) and serving as the shrink agent, additional recurring units (c) derived from such monomers as styrenes, vinylnaphthalenes, vinylanthracenes, acenaphthylenes, (meth)acrylates having an aromatic ester, and (meth)acrylates having a $C_6$-$C_{20}$ cyclic alkyl ester may be copolymerized, if necessary, for the purpose of controlling acid diffusion and improving dry etch resistance. These monomers may have a substituted or unsubstituted hydroxyl group. Also, further recurring units (d) derived from (meth)acrylates or styrenes having an acid labile group-substituted carboxyl group or acid labile group-substituted hydroxyl group, or (meth)acrylates or styrenes having a carboxyl, hydroxyl, cyano, amide, imide, sulfonamide, ester, ether, lactone ring, carbonate or carbamate group may be copolymerized, if necessary, for the purpose of controlling solubility in the stripper solvent.

It is also possible to copolymerize recurring units (b') having an acid labile group. The recurring units (b') may be the same as recurring units (b) in a resist polymer, which will be described later. Particularly when a recurring unit having an acid labile group-substituted carboxyl group is copolymerized with a recurring unit having a tertiary amino group, the resulting copolymer has the advantage of an increased buildup to the resist film in that under the action of acid from the resist film, the acid labile group is deprotected to generate a carboxyl group which in turn forms an intramolecular salt with the tertiary amino group so that the copolymer may turn insoluble.

In the polymer, the recurring units (a), (b'), (c), and (d) are present in proportions a, b', c, and d, respectively, which satisfy the range: $0<a\leq1.0$, $0\leq b'\leq 0.8$, $0\leq c\leq 0.8$, and $0\leq d\leq 0.8$; preferably $0.1\leq a\leq 1.0$, $0\leq b'\leq 0.7$, $0\leq c\leq 0.7$, and $0\leq d\leq 0.7$; and more preferably $0.2\leq a\leq 1.0$, $0\leq b'\leq 0.6$, $0\leq c\leq 0.6$, and $0\leq d\leq 0.6$; provided that $a+b'+c+d=1$.

While the polymer comprising essential recurring units (a) and optional recurring units (b'), (c) and (d) serves as the shrink agent, another polymer may be blended therewith. For example, a blend of inventive polymers comprising a different proportion of units (a), (b'), (c) and (d) or a blend of the inventive polymer with a polymer free of units (a) may be used.

On the other hand, the base resin in the resist composition used to form a resist pattern is a polymer having a solubility in organic solvent that decreases under the action of an acid, specifically a polymer comprising recurring units (b) having an acid labile group-substituted carboxyl group. The unit undergoes neutralization reaction with the tertiary amino group of the shrink agent, and the amine salt of carboxylic acid resulting from neutralization loses solubility in stripper solvent, which contributes to a buildup on the resist surface, i.e., thickening.

Specifically, the recurring units (b) having a carboxyl group substituted with an acid labile group are represented by the general formula (2).

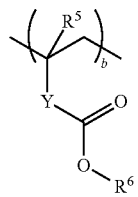

Herein $R^5$ is hydrogen or methyl. $R^6$ is an acid labile group. Y is a single bond or —C(=O)—O—$R^7$—, wherein $R^7$ is a straight, branched or cyclic $C_1$-$C_{10}$ alkylene group which may contain an ether or ester moiety, or a naphthylene group. The subscript b is a number in the range: 0<b<1.0.

The recurring units (b) having an acid labile group-substituted carboxyl group are described, for example, in JP-A 2012-37867, paragraphs [0035]-[0075]. Further, there may be copolymerized an adhesive group selected from among hydroxyl, lactone ring, ether, ester, carbonyl and cyano groups as described in JP-A 2012-37867, paragraphs [0076]-[0084], an indene, acenaphthylene, chromone, coumarin, and norbornadiene as described in paragraph [0085], a styrene, vinylnaphthalene, vinylanthracene, vinylpyrene, and methyleneindane as described in paragraph [0088], and an acid generator in the form of an onium salt having polymerizable olefin as described in paragraphs [0089]-[0091].

The following discussion applies to both the polymer serving as the shrink agent and the polymer serving as the base resin in the resist composition, both used in the patterning process. The polymer should preferably have a weight average molecular weight (Mw) in the range of 1,000 to 500,000, and more preferably 2,000 to 100,000, as measured by GPC versus polystyrene standards. If Mw is too low, in the case of shrink agent, the amount of shrinkage may become slight, and in the case of resist composition, the diffusion distance of acid generated by PAG may be extended to invite a drop of resolution. If Mw is too high, in the case of shrink agent, despite the advantage of increased shrinkage, its solubility in stripper solvent may be reduced, leaving scum in spaces at the end of removal step, and in the case of resist composition, a footing phenomenon is likely to occur after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymers used herein may be synthesized by any desired method, for example, by dissolving one or more monomers in an organic solvent, adding a radical initiator thereto, and effecting heat polymerization. The monomers used herein include monomers corresponding to recurring units (a), (b'), (c) and (d) in the case of shrink agent polymer, and monomers corresponding to acid labile group-bearing recurring units (b) and adhesive group-bearing recurring units in the case of resist polymer, and other unsaturated bond-bearing monomers. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and the resulting polymer be protected or partially protected.

Although the polymer can serve as the shrink agent independent of whether recurring units (a), (b'), (c) and (d) are copolymerized randomly or blockwise, block copolymerization is preferred because of improved CD uniformity of the pattern after shrinkage. When a block copolymer is applied as the shrink agent, hydrophilic units (a) subject to neutralization reaction with acid and carboxylic acid are arranged on the resist surface side and hydrophobic units (b'), (c) and (d) are arranged on the opposite side. The shrink agent having a self-assembling function as in the case of DSA is effective for significantly improving the CD uniformity of holes after development.

Where random copolymerization is carried out in a radical polymerization mode, it is a common practice to mix comonomers with a radical initiator and subject the mixture to heat polymerization. Specifically, polymerization of monomers (a) is started in the presence of a radical initiator, and monomers (b'), (c) and (d) are later added. There is obtained a polymer consisting of units (a) on one side and units (b'), (c) and (d) on the other side of its molecule. However, this polymer has a different architecture from the block copolymer because the intermediate portion is a mixture of units (a) and units (b'), (c) and (d). To form a block copolymer by radical polymerization, living radical polymerization is preferably used. In the living radical polymerization technique, known as reversible addition-fragmentation chain transfer (RAFT) polymerization, living radicals are always available at the polymer terminus. Then a block copolymer consisting of recurring units (a) and recurring units (b'), (c) and (d) can be formed by starting polymerization of monomer (a) and adding monomers (b'), (c) and (d) at the stage when monomer (a) is consumed.

A chain transfer agent is necessary to perform RAFT polymerization. Examples of the chain transfer agent include 2-cyano-2-propyl benzodithioate, 4-cyano-4-phenylcarbonothioylthiopentanoic acid, 2-cyano-2-propyl dodecyltrithiocarbonate, 4-cyano-4-[(dodecylsulfanylthiocarbonyl)sulfanyl]pentanoic acid, 2-(dodecylthiocarbonothioylthio)-2-methylpropanoic acid, cyanomethyl dodecylthiocarbonate, cyanomethyl methyl(phenyl)carbamothioate, bis(thiobenzoyl)disulfide, and bis(dodecylsulfanylthiocarbonyl)disulfide. Inter alia, 2-cyano-2-propyl benzodithioate is most preferred.

Alternatively, a block copolymer can be formed by living anion polymerization. In this case, an organometallic compound is used as the anion species, for example, alkyl lithium, alkyl magnesium halide, naphthalene sodium, and alkylated lanthanoid compounds. Inter alia, butyllithium and butylmagnesium chloride are preferred.

The shrink agent used in the pattern forming process further contains an organic solvent and optionally a salt, basic compound and surfactant.

Typically, the shrink agent contains the polymer of formula (1) in an organic solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms. Preferably, the organic solvent is selected such that the patterned resist film after development may experience a thickness loss of up to 10 nm when the film is kept in contact with the solvent for 30 seconds.

Examples of the ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms include di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, butyl acetate, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, and 2-phenylethyl acetate, which may be used alone or in admixture of two or more.

Of the organic solvents, ether solvents of 6 to 12 carbon atoms, especially 8 to 12 carbon atoms are preferred because the resist pattern is not dissolved therein. If ester and ketone solvents which may also be used in the resist composition are used in the shrink agent, there may arise a problem that when the shrink agent is applied onto the resist pattern, the shrink agent can be intermixed with the resist pattern whereby the resist pattern is dissolved away. To avoid this problem, ether solvents of 6 to 12 carbon atoms, especially 8 to 12 carbon atoms in which the polymer in the resist composition is not dissolvable are preferably used as the shrink agent. Exemplary of the ether solvents of 6 to 12 carbon atoms, especially 8 to 12 carbon atoms are di-n-butyl ether, diisobutyl ether, di-sec-butyl ether, di-n-pentyl ether, diisopentyl ether, di-sec-pentyl ether, di-tert-amyl ether, and di-n-hexyl ether, which may be used alone or in admixture of two or more.

In the shrink agent solution, the solvent is preferably used in an amount of 100 to 100,000 parts, more preferably 200 to 50,000 parts by weight per 100 parts by weight of the polymer.

To the shrink agent, a salt and basic compound may be added if desired. The salt that can be added is typically selected from sulfonium salts and iodonium salts which are typically added to resist compositions, and ammonium salts. The basic compound that can be added may be selected from those basic compounds which are typically added to resist compositions, for example, primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives. The addition of the salt or basic compound is effective for suppressing excessive diffusion of acid from within the resist film and for controlling the amount of shrinkage. The surfactant that can be added may be selected from those surfactants which are typically added to resist compositions.

In the shrink agent, preferably the salt is used in an amount of 0 to 50 parts by weight, the basic compound is used in an amount of 0 to 30 parts by weight, and the surfactant is used in an amount of 0 to 10 parts, more preferably 0 to 5 parts by weight, all per 100 parts by weight of the polymer. When added, each additive is preferably used in an amount of at least 0.1 part by weight.

The resist composition comprises the polymer as base resin, an organic solvent, and an acid generator (i.e., compound capable of generating an acid in response to high-energy radiation), and optionally, a dissolution regulator, basic compound, surfactant, acetylene alcohol, and other components.

Specifically, the resist composition contains an acid generator such that it may function as a chemically amplified resist composition. The acid generator is typically a compound capable of generating an acid in response to actinic light or radiation, known as photoacid generator (PAG). An appropriate amount of the PAG used is 0.5 to 30 parts, more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary of the acid generated by PAG are sulfonic acids, imidic acids and methide acids. Of these, sulfonic acids which are fluorinated at α-position are most commonly used. Where the acid labile group is an acetal group susceptible to deprotection, fluorination at α-position is not always necessary. Where the base polymer has recurring units of acid generator copolymerized therein, the acid generator need not be separately added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

Exemplary basic compounds include primary, secondary and tertiary amine compounds, specifically amine compounds having a hydroxyl, ether, ester, lactone, cyano or sulfonate group, as described in JP-A 2008-111103, paragraphs [0146] to [0164], and compounds having a carbamate group, as described in JP 3790649. Also, onium salts such as sulfonium salts, iodonium salts and ammonium salts of sulfonic acids which are not fluorinated at α-position as described in US 2008153030 (JP-A 2008-158339) and similar onium salts of carboxylic acid as described in JP 3991462 may be used as the quencher.

Where the acid labile group is an acetal group which is very sensitive to acid, the acid for eliminating the protective group need not necessarily be a sulfonic acid which is fluorinated at α-position, imidic acid or methide acid. Even with a sulfonic acid which is not fluorinated at α-position, deprotection reaction may take place in some cases. Since an onium salt of sulfonic acid cannot be used as the quencher in this event, an onium salt of imidic acid is preferably used alone.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin. The dissolution regulator, surfactant and acetylene alcohol may be used in any suitable amounts, depending on their purpose of addition.

Figure 1B:
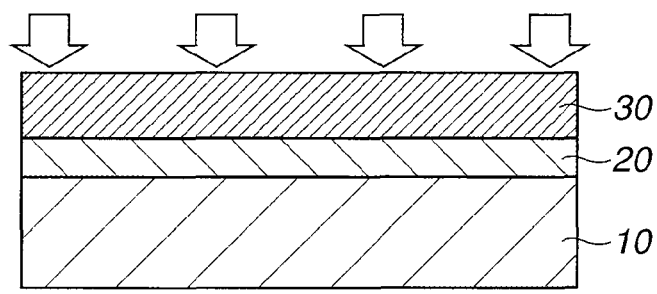
Figure 1C:
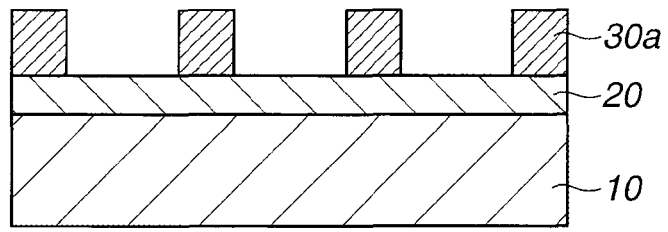

Referring to FIGS. 1 and 2, the pattern shrinking process of the invention is described. First, as shown in FIG. 1 (A), a chemically amplified resist composition is applied onto a processable substrate 20 on a substrate 10 to form a photoresist film 30 thereon. If necessary, a hard mask layer (not shown) may intervene between the resist film 30 and the processable substrate 20. By standard techniques, the resist film 30 is subjected to exposure (FIG. 1 (B)), PEB, and organic solvent development to form a negative resist pattern 30a (FIG. 1 (C)). A shrink agent 40 is applied onto the negative resist pattern 30a to cover the pattern as shown in FIG. 2 (D). The shrink agent coating is baked to evaporate off the solvent therefrom and to form a salt between the carboxyl group on the resist film and the tertiary amino group in the shrink agent. A portion of the shrink agent polymer which has become the carboxylic acid salt is insoluble in the stripper solvent. Thereafter, a solvent stripper is applied to remove the excessive shrink agent 40, leaving a shrink agent film 40 over the resist pattern 30b. This means that the resist pattern 30b is thickened, that is, the width of spaces in the resist pattern is shrunk as shown in FIG. 2 (E). Using the shrunk pattern as a mask, the processable substrate 20 is dry etched as shown in FIG. 2 (F).

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask may be of $SiO_2$, SiN, SiON or p-Si. Sometimes, an undercoat in the form of carbon film or a silicon-containing intermediate film may be laid instead of the hard mask, and an organic antireflective coating may be interposed between the hard mask and the resist film.

While a resist film (30) of a chemically amplified resist composition is formed on a processable substrate (20) on a substrate (10) directly or via an intermediate intervening layer as mentioned above, the resist film preferably has a thickness of 10 to 1,000 nm and more preferably 20 to 500 nm. Prior to exposure, the resist film is heated or prebaked, preferably at a temperature of 50 to 180° C., especially 60 to 150° C. for a time of 10 to 300 seconds, especially 15 to 200 seconds.

Next the resist film is exposed. For the exposure, preference is given to high-energy radiation having a wavelength of 140 to 250 nm, especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light through a projection lens, with pure water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of 4 to 10 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 mJ/cm², more preferably about 10 to 100 mJ/cm². This is followed by baking (PEB) on a hot plate at 50 to 150° C. for 1 to 5 minutes, preferably at 60 to 120° C. for 1 to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, a negative resist pattern is formed on the substrate.

The organic solvent used as developer is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film may be rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, t-butylbenzene, and mesitylene. The solvents may be used alone or in admixture. After the rinse liquid is applied, the substrate may be dried by spin drying and bake. However, rinsing is not essential. As long as the step of spin drying the substrate after the developer is applied thereto is included, the rinsing step may be omitted.

Following the development, the shrink agent of the invention is applied onto the resist pattern to form a shrink agent coating, preferably having a thickness of 1 to 100 nm, more preferably 1.5 to 50 nm. The shrink agent coating is baked at a temperature of 40 to 150° C. for 5 to 300 seconds to evaporate off the solvent and to induce neutralization reaction between the resist film and the shrink agent.

Finally, the excessive shrink agent is removed, preferably using the same solvent as used in the shrink agent. The stripper solvent is preferably selected from among ether solvents of 6 to 12 carbon atoms, alcohol solvents of 4 to 10 carbon atoms, hydrocarbon solvents of 6 to 12 carbon atoms, ester solvents of 6 to 16 carbon atoms, ketone solvents of 7 to 16 carbon atoms, and mixtures thereof.

EXAMPLE

Examples of the invention are given below by way of illustration and not by way of limitation. The abbreviation "pbw" is parts by weight, and PGMEA is propylene glycol monomethyl ether acetate. For all polymers, Mw and Mn are determined by GPC versus polystyrene standards.

Synthesis Example 1

Polymers (for use in shrink agent and resist composition) were synthesized by combining suitable monomers in tetrahydrofuran solvent, effecting copolymerization reaction, crystallizing from methanol, repeatedly washing with hexane, isolation and drying. There were obtained random copolymers, designated Polymers 1 to 8, Blend Polymer 1, Comparative Polymers 1, 2, Resist Polymer 1, and Water-repellent Polymer 1. The polymers were analyzed for composition by ¹H-NMR spectroscopy and for Mw and Mw/Mn by GPC. The polymers are identified below with their analytical data.

Polymer 1

Mw=65,000

Mw/Mn=2.22

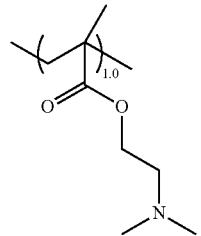

Polymer 1

Polymer 2

Mw=96,000

Mw/Mn=2.10

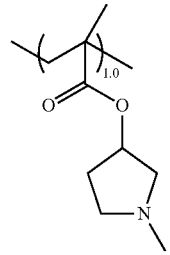

Polymer 2

Polymer 3
  Mw=26,000
  Mw/Mn=1.84
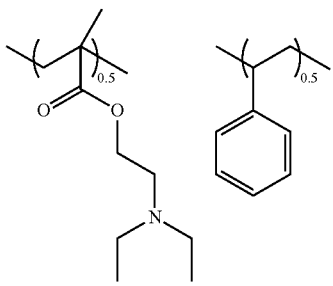
Polymer 4
  Mw=19,300
  Mw/Mn=1.94
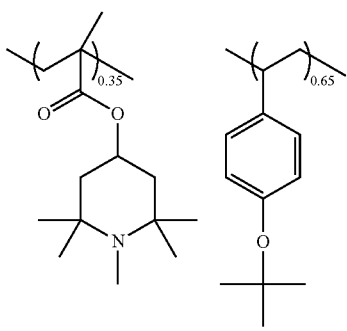
Polymer 5
  Mw=23,000
  Mw/Mn=1.97
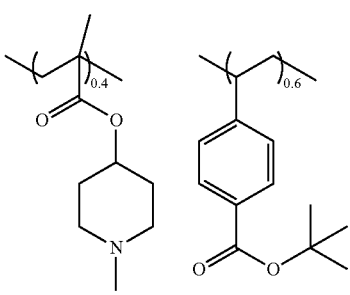
Polymer 6
  Mw=12,300
  Mw/Mn=1.79
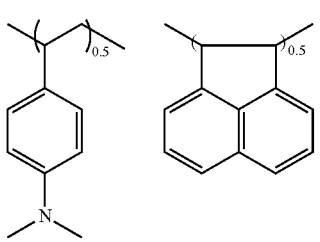
Polymer 7
  Mw=9,900
  Mw/Mn=1.97
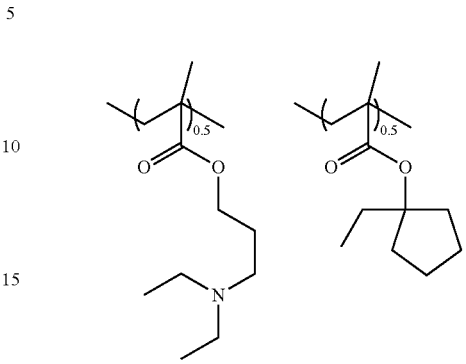
Polymer 8
  Mw=36,500
  Mw/Mn=1.76
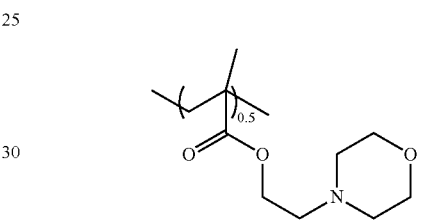
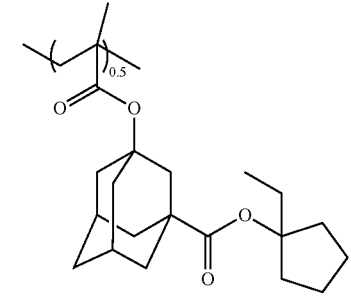
Blend Polymer 1
  Mw=36,500
  Mw/Mn=1.76
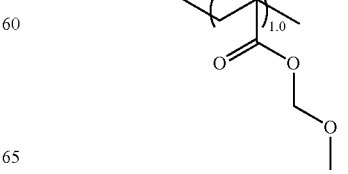

Comparative Polymer 1
 Mw=7,800
 Mw/Mn=1.68

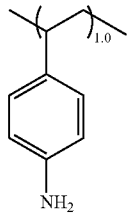
Comparative Polymer 1

Comparative Polymer 2
 Mw=8,100
 Mw/Mn=1.82

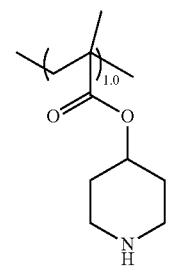
Comparative Polymer 2

Resist Polymer 1
 Mw=7,500
 Mw/Mn=1.61

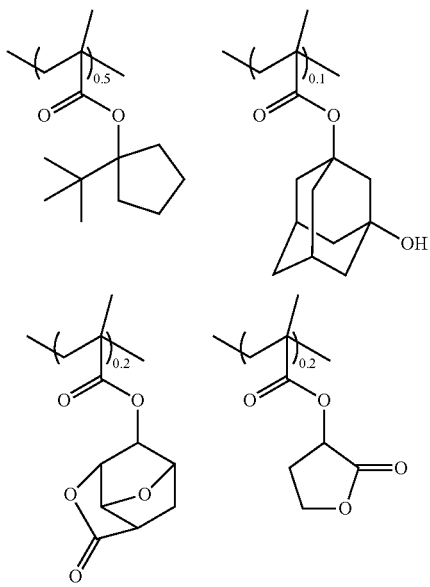
Resist Polymer 1

Water-repellent Polymer 1
 Mw=7,800
 Mw/Mn=1.55

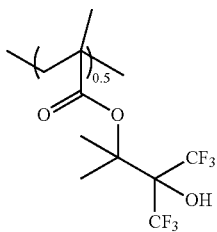
Water-repellent Polymer 1

Synthesis Example 2

As the polymer for use in shrink agent, Block Copolymer 1 was prepared by RAFT polymerization. In a nitrogen atmosphere, 2.1 g of styrene, 0.15 g of 2-cyano-2-propyl benzodithioate, and 0.04 g of 2,2'-azobisisobutyronitrile were dissolved in 11 g of methyl ethyl ketone. In the nitrogen atmosphere, the solution was stirred at 80° C. for 4 hours. Subsequently, a solution of 3.1 g of 2-(dimethylamino)ethyl methacrylate in 3 g of methyl ethyl ketone was added dropwise to the reaction solution, which was stirred at 80° C. for a further 4 hours. The polymerization solution was cooled to room temperature and added dropwise to 300 g of hexane. The precipitated solid matter was collected by filtration, washed with 120 g of hexane, and vacuum dried at 60° C. for 15 hours, yielding Block Copolymer 1 as identified below.

Block Copolymer 1
 Mw=26,000
 Mw/Mn=1.20

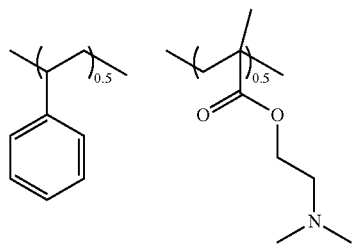
Block Copolymer 1

Examples 1 to 15 and Comparative Examples 1 to 3

A shrink agent solution was prepared by mixing the polymer synthesized above (Polymers 1 to 8, Blend Polymer 1, Comparative Polymers 1, 2, or Block Copolymer 1), additive (e.g., sulfonium salt or quencher), and solvent in accordance with the formulation of Table 1, and filtering through a Teflon® filter having a pore size of 0.2 μm. Notably, in the preparation of Comparative Shrink agent 1, Comparative Polymer 1 could not be dissolved in the solvent.

Components shown in Table 1 are identified below.

Sulfonium Salts 1, 2 and Amine Quencher 1 of the Following Structural Formulae

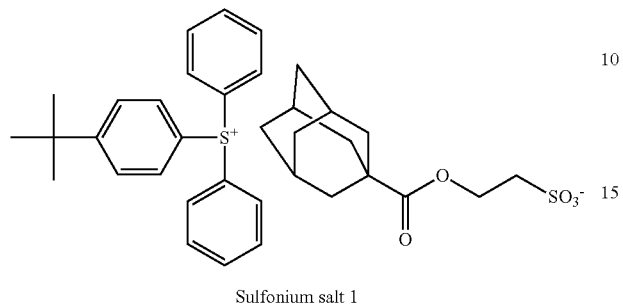

Sulfonium salt 1

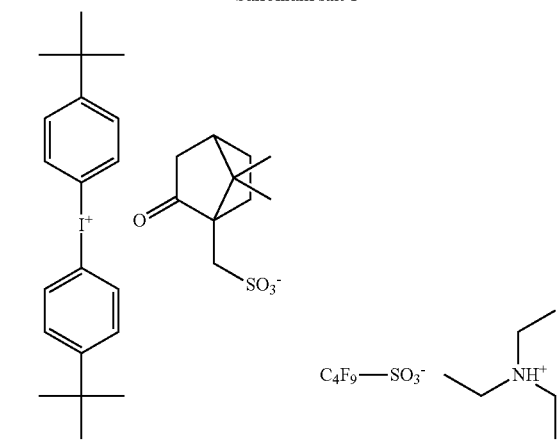

Sulfonium salt 2     Ammonium salt 1

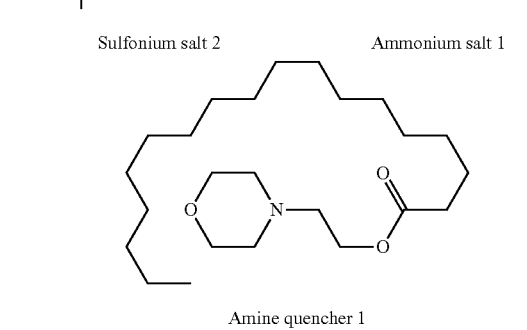

Amine quencher 1

TABLE 1

| Shrink agent | | Polymer (pbw) | Additive (pbw) | Organic solvent (pbw) |
|---|---|---|---|---|
| Shrink agent | 1 | Polymer 1 (100) | — | 4-methyl-2-pentanol(3,000) |
| | 2 | Polymer 2 (100) | — | diisoamyl ether(300) 4-methyl-2-pentanol(2,800) |
| | 3 | Polymer 3 (100) | — | di-n-pentyl ether(3,000) 2-methyl-1-butanol(500) |
| | 4 | Polymer 4 (100) | — | di-n-butyl ether(3,000) 3-methyl-1-butanol(500) |
| | 5 | Polymer 5 (100) | — | di-n-butyl ether(3,600) 3-methyl-1-butanol(500) |
| | 6 | Polymer 6 (100) | — | di-sec-pentyl ether(3,000) 3-methyl-3-pentanol(400) |
| | 7 | (100) | — | 4-methyl-2-pentanol(1,000) |
| | 8 | Polymer 8 (100) | — | diisoamyl ether(1,600) 2-methyl-2-pentanol(600) |

TABLE 1-continued

| Shrink agent | | Polymer (pbw) | Additive (pbw) | Organic solvent (pbw) |
|---|---|---|---|---|
| | 9 | Polymer 1 (70) Blend Polymer 1 (30) | — | diisoamyl ether(1,600) 2-methyl-2-pentanol(600) |
| | 10 | Block Copolymer 1 (100) | — | diisoamyl ether(1,600) 4-methyl-2-pentanol(1,000) |
| | 11 | Polymer 1 (100) | Sulfonium salt 1 (2.0) | diisoamyl ether(1,600) 4-methyl-2-pentanol(1,000) |
| | 12 | Polymer 1 (100) | Amine quencher 1 (0.5) | diisoamyl ether(1,600) 4-methyl-2-pentanol(1,000) |
| | 13 | Polymer 1 (100) | — | butyl acetate(600) 4-methyl-2-pentanol(2,400) |
| | 14 | Polymer 1 (100) | Ammonium salt 1 (2.0) | amyl acetate(600) 4-methyl-2-pentanol(2,400) |
| Comparative shrink agent | 1 | Comparative Polymer 1 (100) | — | 4-methyl-2-pentanol(3,000) |
| | 2 | Comparative Polymer 2 (100) | — | 4-methyl-2-pentanol(3,000) |
| | 3 | Polymer 1 (100) | — | PGMEA(3,000) |
| | 4 | Polymer 1 (100) | — | butyl acetate(3,000) |

Preparation of Resist Composition

A resist composition in solution form was prepared by dissolving a polymer (Resist Polymer 1), acid generator, quencher, and water-repellent polymer in a solvent in accordance with the formulation of Table 2, and filtering through a filter with a pore size of 0.2 μm. The solvent contained 100 ppm of surfactant FC-4430 (3M-Sumitomo Co., Ltd.). The quencher and water-repellent polymer are shown above.

Acid Generator: PAG1 of the Following Structural Formula

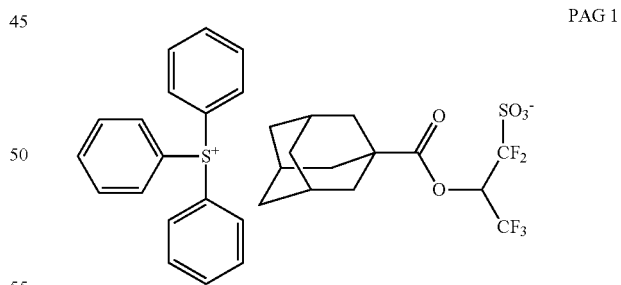

PAG 1

TABLE 2

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG1 (5.0) | Sulfonium salt 1 (5.0) | Water-repellent polymer 1 (3.0) | PGMEA (2,500) γ-butyrolactone (200) |

TABLE 2-continued

| Resist | Polymer (pbw) | Acid generator (pbw) | Quencher (pbw) | Water repellent (pbw) | Organic solvent (pbw) |
|---|---|---|---|---|---|
| Resist 2 | Resist Polymer 1 (100) | PAG1 (10.0) | Amine quencher 1 (2.0) | Water-repellent polymer 1 (3.0) | PGMEA (2,500) γ-butyrolactone (200) |

ArF Lithography Patterning Test

On a silicon wafer, a spin-on carbon film ODL-102 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition in Table 2 was spin coated, then baked on a hot plate at 100° C. for 60 seconds to form a resist film of 100 nm thick. Using an ArF excimer laser immersion lithography scanner NSR-610C (Nikon Corp., NA 1.30, σ 0.98/0.78, dipole opening 20 deg., azimuthally polarized illumination), the resist film was exposed through a 6% halftone phase shift mask while varying the exposure dose. After the exposure, the resist film was baked (PEB) at 90° C. for 60 seconds and puddle developed in n-butyl acetate for 30 seconds to form a trench pattern having a space width of 45 nm and a pitch of 100 nm.

The shrink agent shown in Table 1 was applied onto the resist pattern after development to cover the pattern. The shrink agent coating was baked at the temperature shown in Table 3 for 60 seconds. While the wafer was spun at 200 rpm, 4-methyl-2-pentanol was dispensed on the wafer to strip off the excessive shrink agent. Both after development and after shrink treatment, the pattern was observed under a CD-SEM (CG-4000 by Hitachi, Ltd.) to measure the size of trenches at a pitch of 100 nm and to examine the cross-sectional profile. The results are shown in Table 3.

TABLE 3

| | | Resist | Pattern size after development (nm) | Shrink agent | Bake temp. (° C.) | Pattern size after removal of shrink agent (nm) | Cross-sectional profile after removal of shrink agent |
|---|---|---|---|---|---|---|---|
| Example | 1 | Resist 1 (100) | 45 | Shrink agent 1 | 120 | 33 | rectangular profile with no deposit on substrate surface |
| | 2 | Resist 2 (100) | 46 | Shrink agent 1 | 110 | 31 | rectangular profile with no deposit on substrate surface |
| | 3 | Resist 1 (100) | 45 | Shrink agent 2 | 110 | 33 | rectangular profile with no deposit on substrate surface |
| | 4 | Resist 1 (100) | 45 | Shrink agent 3 | 100 | 32 | rectangular profile with no deposit on substrate surface |
| | 5 | Resist 1 (100) | 45 | Shrink agent 4 | 100 | 33 | rectangular profile with no deposit on substrate surface |
| | 6 | Resist 1 (100) | 45 | Shrink agent 5 | 100 | 31 | rectangular profile with no deposit on substrate surface |
| | 7 | Resist 1 (100) | 45 | Shrink agent 6 | 120 | 34 | rectangular profile with no deposit on substrate surface |
| | 8 | Resist 1 (100) | 45 | Shrink agent 7 | 130 | 35 | rectangular profile with no deposit on substrate surface |
| | 9 | Resist 1 (100) | 45 | Shrink agent 8 | 110 | 35 | rectangular profile with no deposit on substrate surface |
| | 10 | Resist 1 (100) | 45 | Shrink agent 9 | 110 | 22 | rectangular profile with no deposit on substrate surface |
| | 11 | Resist 1 (100) | 45 | Shrink agent 10 | 90 | 22 | rectangular profile with no deposit on substrate surface |
| | 12 | Resist 1 (100) | 45 | Shrink agent 11 | 110 | 29 | rectangular profile with no deposit on substrate surface |
| | 13 | Resist 1 (100) | 45 | Shrink agent 12 | 110 | 31 | rectangular profile with no deposit on substrate surface |
| | 14 | Resist 1 (100) | 45 | Shrink agent 13 | 110 | 35 | rectangular profile with no deposit on substrate surface |
| | 15 | Resist 1 (100) | 45 | Shrink agent 14 | 110 | 30 | rectangular profile with no deposit on substrate surface |

TABLE 3-continued

| | |Resist|Pattern size after development (nm)|Shrink agent|Bake temp. (° C.)|Pattern size after removal of shrink agent (nm)|Cross-sectional profile after removal of shrink agent|
|---|---|---|---|---|---|---|---|
|Comparative Example|1|Resist 1 (100)|45|Comparative shrink agent 2|110|47|tapered profile with deposit on substrate surface|
| |2|Resist 1 (100)|45|Comparative shrink agent 3|110|pattern vanished|—|
| |3|Resist 1 (100)|45|Comparative shrink agent 4|110|42|rectangular profile with no deposit on substrate surface|

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

Japanese Patent Application No. 2014-108120 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
applying a resist composition comprising a polymer comprising recurring units having an acid labile group-substituted carboxyl group, an acid generator and an organic solvent onto a substrate,
prebaking to form a resist film,
exposing the resist film to high-energy radiation,
baking the film,
developing the exposed resist film in an organic solvent-based developer to form a negative pattern,
applying a shrink agent onto the negative pattern, the shrink agent being a solution of a polymer comprising recurring units having a tertiary amino group in a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms,
baking, and
removing the excessive shrink agent for thereby shrinking the size of spaces in the pattern.

2. The pattern forming process of claim 1 wherein the polymer comprising recurring units having a tertiary amino group has the general formula (1):

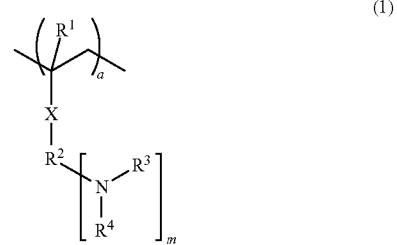

wherein $R^1$ is hydrogen or methyl, X is a single bond, phenylene or —C(=O)—O—, m is 1 or 2, in case of m=1, $R^2$ is a single bond, a straight, branched or cyclic $C_1$-$C_{10}$ alkylene group which may contain an ether moiety, ester moiety, —N= or —S—, a phenylene or naphthylene group, in case of m=2, $R^2$ is a trivalent group obtained by eliminating one hydrogen from the above alkylene, phenylene or naphthylene group of $R^2$ for m=1, $R^3$ and $R^4$ are each independently a straight or branched $C_1$-$C_4$ alkyl group, or $R^3$ and $R^4$ may bond together to form a ring with the nitrogen atom to which they are attached, the ring optionally containing an ether bond, or either one of $R^3$ and $R^4$ may bond with $R^2$ to form a ring with the nitrogen atom to which they are attached, and $0<a\leq 1.0$.

3. The pattern forming process of claim 1 wherein the solvent of the shrink agent is selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms, such that the patterned resist film after development may experience a thickness loss of up to 10 nm when the film is kept in contact with the solvent for 30 seconds.

4. The pattern forming process of claim 1 wherein the solvent of the shrink agent is selected from the group consisting of di-n-butyl ether, diisobutyl ether, di-sec-butyl ether, di-n-pentyl ether, diisopentyl ether, di-sec-pentyl ether, di-tert-amyl ether, di-n-hexyl ether, methyl cyclopentyl ether, methyl cyclohexyl ether, methyl phenyl ether, methyl benzyl ether, ethyl cyclopentyl ether, ethyl cyclohexyl ether, ethyl phenyl ether, ethyl benzyl ether, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl- 1-pentanol, 4-methyl-2-pentanol, 4-methyl-3-pentanol, cyclohexanol, 1-octanol, benzene, toluene, xylene, mesitylene, ethylbezene, n-propylbenzene, cumene, n-butylbenzene, cymene, amylbenzene, diethylbenzene, octane, nonane, decane, turpentine oil, pinene, 2-octanone, 2-nonanone, 2-heptanone, 3-heptanone, 4-heptanone, 2-hexanone, 3-hexanone, diisobutyl ketone, methylcyclohexanone, acetophenone, methylacetophenone, ethyl n-butyl ketone, di-n-butyl ketone, butyl acetate, amyl phoronate, amyl acetate, isoamyl acetate, 2-ethylhexyl acetate, cyclohexyl acetate, methylcyclohexyl acetate, hexyl formate, ethyl valerate, propyl valerate, isopropyl valerate, butyl valerate, isobutyl valerate, tert-butyl valerate, amyl valerate, isoamyl valerate, ethyl isovalerate, propyl isovalerate, isopropyl isovalerate, butyl isovalerate, isobutyl isovalerate, tert-butyl isovalerate, isoamyl isovalerate, ethyl pivalate, propyl pivalate, isopropyl pivalate, butyl pivalate, tert-butyl pivalate, ethyl pentenoate, propyl pentenoate, isopropyl pentenoate, butyl pentenoate, tert-butyl pentenoate, propyl crotonate, isopropyl crotonate, butyl crotonate, tert-butyl crotonate, butyl propionate, isobutyl propionate, tert-butyl propionate, benzyl propionate, propyl butyrate, butyl butyrate, isobutyl butyrate, tert-butyl butyrate, methyl benzoate, ethyl benzoate, propyl benzoate, butyl benzoate, phenyl acetate, benzyl acetate, methyl phenylacetate, benzyl formate, phenylethyl formate, methyl 3-phenylpropionate, ethyl phenylacetate, 2-phenylethyl acetate, and a mixture thereof.

5. The pattern forming process of claim 1 wherein the removing step uses a solvent selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms.

6. The pattern forming process of claim 1 wherein the polymer in the resist composition comprises recurring units (b) having the general formula (2):

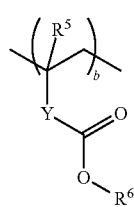

(2)

wherein $R^5$ is hydrogen or methyl, $R^6$ is an acid labile group, Y is a single bond or —C(=O)—O—$R^7$—, $R^7$ is a straight, branched or cyclic $C_1$-$C_{10}$ alkylene group which may contain an ether or ester moiety, or naphthylene group, and $0<b<1.0$.

7. The pattern forming process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

8. A shrink agent for use with a resist pattern for shrinking the size of spaces in the resist pattern, comprising a polymer comprising recurring units having a tertiary amino group and a solvent, wherein the polymer comprising recurring units having a tertiary amino group is represented by the general formula (1):

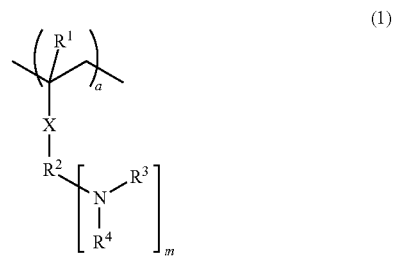

(1)

wherein $R^1$ is hydrogen or methyl, X is a single bond, phenylene or —C(=O)—O—, m is 1 or 2, in case of m=1, $R^2$ is a single bond, a straight, branched or cyclic $C_1$-$C_{10}$ alkylene group which may contain an ether moiety, ester moiety, —N= or —S—, a phenylene or naphthylene group, in case of m=2, $R^2$ is a trivalent group obtained by eliminating one hydrogen from the above group of $R^2$ for m=1, $R^3$ and $R^4$ are each independently a straight or branched $C_1$-$C_4$ alkyl group, or $R^3$ and $R^4$ may bond together to form a ring with the nitrogen atom to which they are attached, the ring optionally containing an ether bond, or either one of $R^3$ and $R^4$ may bond with $R^2$ to form a ring with the nitrogen atom to which they are attached, and $0<a\leq1.0$, and the solvent is selected from the group consisting of ether solvents of 6 to 12 carbon atoms, alcohol solvents of 4 to 10 carbon atoms, hydrocarbon solvents of 6 to 12 carbon atoms, ester solvents of 6 to 16 carbon atoms, and ketone solvents of 7 to 16 carbon atoms.

9. The pattern forming process of claim 2 wherein the polymer further comprises:

recurring units (c) derived from monomers selected from the group consisting of styrenes, vinylnaphthalenes, vinylanthracenes, acenaphthylenes, (meth)acrylates having an aromatic ester, and (meth)acrylates having a $C_6$-$C_{20}$ cyclic alkyl ester, recurring units (d) derived from (meth)acrylates or styrenes having an acid labile group-substituted carboxyl group or acid labile group-substituted hydroxyl group, or (meth)acrylates or styrenes having a carboxyl, hydroxyl, cyano, amide, imide, sulfonamide, ester, ether, lactone ring, carbonate or carbamate, and/or recurring units (b') having an acid labile group.

10. The shrink agent of claim 8 wherein the polymer further comprises:

recurring units (c) derived from monomers selected from the group consisting of styrenes, vinylnaphthalenes, vinylanthracenes, acenaphthylenes, (meth)acrylates having an aromatic ester, and (meth)acrylates having a $C_6$-$C_{20}$ cyclic alkyl ester, recurring units (d) derived from (meth)acrylates or styrenes having an acid labile group-substituted carboxyl group or acid labile group-substituted hydroxyl group, or (meth)acrylates or styrenes having a carboxyl, hydroxyl, cyano, amide, imide, sulfonamide, ester, ether, lactone ring, carbonate or carbamate, and/or recurring units (b') having an acid labile group.

* * * * *